United States Patent
Bazan et al.

(10) Patent No.: US 6,515,317 B1
(45) Date of Patent: Feb. 4, 2003

(54) SIDEWALL CHARGE-COUPLED DEVICE WITH MULTIPLE TRENCHES IN MULTIPLE WELLS

(75) Inventors: Gregory Bazan, Essex, VT (US); William A. Klaasen, Underhill, VT (US); Randy W. Mann, Jericho, VT (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/670,594

(22) Filed: Sep. 29, 2000

(51) Int. Cl.⁷ .................................. H01L 29/78
(52) U.S. Cl. .............. 257/215; 257/214; 257/220; 257/267; 257/274; 257/243; 257/244

(58) Field of Search .................. 257/264, 215, 257/214, 243, 220, 244, 274

(56) References Cited

U.S. PATENT DOCUMENTS

| | | | | |
|---|---|---|---|---|
| 5,086,010 A | * | 2/1992 | Kimura | 437/53 |
| 5,159,419 A | * | 10/1992 | Hosack | |
| 5,173,756 A | * | 12/1992 | Wong et al. | 257/243 |
| 5,223,726 A | * | 6/1993 | Yamada et al. | 257/244 |

\* cited by examiner

*Primary Examiner*—Fetsum Abraham
(74) *Attorney, Agent, or Firm*—Connolly Bove Lodge & Hutz, LLP; Joseph P. Abate, Esq.

(57) ABSTRACT

Increased pixel density and increased sensitivity to blue light are provided in a charge couple device employing sidewall and surface gates.

9 Claims, 6 Drawing Sheets

SIDEWALL CHARGE-COUPLED DEVICE WITH MULTIPLE TRENCHES IN MULTIPLE WELLS

TECHNICAL FIELD

The present invention relates to a method for significantly increasing the pixel density and blue light sensitivity in a charge couple device (CCD). More particularly, the present invention involves the use of sidewall as well as surface gates to increase pixel density without decreasing total gate area. Portions of the gates occupy vertical sidewalls, thus a relatively larger portion of the horizontal area is available for openings in the polysilicon gates to admit more light into the channel region. This arrangement permits the density of the pixel array to increase without any loss of sensitivity. The process of the present invention makes it possible to achieve active storage area, progressive scan CCD image sensors incorporating vertical anti-blooming device structures.

BACKGROUND OF INVENTION

A charge couple device (CCD) functions as an active matrix to absorb light and convert it to electrons. Such are used for example as the electronic film in digital still cameras (DSC).

Charge-coupled devices are solid-state devices that, when formed in arrays and used with suitable imaging hardware, can be used to capture video images.

FIGS. 1, 2A and 2B illustrate prior art 4-phase charge-coupled device structure. FIG. 1 is a top view showing horizontal signal lines running over the channel stop regions and making connections to every fourth gate. Four gates over a channel region comprise a pixel, so the drawing shows three complete pixels. The gates are comprised of overlapping but electrically isolated polysilicon lines running vertically. Holes in the polysilicon lines allow light energy to enter and induce an electron—hole pair when the photon energy exceeds the Si bandgap. Electrical fields cause the electrons to be swept into the channel regions under the gates. Once the image is stored, it is read out much like a shift register would read out. Signals 1 through 4 force the stored charge to move to the right as two adjacent gates are always turned on together. Holding the voltage high on gates 1 and 2 while keeping the voltage low on gates 3 and 4 creates a potential well under gates 1 and that collects photo-induced charge for the pixel. Changing the voltage on 1 to low and on 3 to high forces the charge to move from under the 1 and 2 gates to under the 2 and 3 gates. Reversing polarity on the 2 and 4 gates moves the charge under the 3 and 4 gates. The process is repeated until all the original charge in the pixel is now in the new pixel. Of course, any charge in the previous pixel is now in this pixel. This comprises one transfer cycle. The transfer cycles are repeated until all pixels have been read out, each being moved across the array. Extremely high transfer efficiency is desired because several thousand transfers may be required for the charge to reach the edge of the array.

FIG. 2A is a cross-sectional view through line A—A of FIG. 1 showing the overlap of the polysilicon gates along the channel.

FIG. 2B is a cross-sectional view through line B of FIG. 1 across several channel regions. A peaked P well is present as a vertical antiblooming device. Recess oxidation (ROX) with P-type channel stops acts as isolation between adjacent channel regions. If CCD's are overexposed (the potential wells under the gates can not hold all the charge), the extra charge will spill over into adjacent pixels. The antiblooming device shown is of the vertical antiblooming type. When collected charge in the channel reaches the well, the excess charge is collected in the substrate.

Dark current is another problem associated with CCD's. Dark current is noise resulting from electrons generated by thermal vibration, by surface states, or in bulk defects. These electrons may collect under the gates, causing white spots and columns in the resulting readout. Dark current is minimized by elimination of all mechanisms, other than light absorption, that are capable of generating electron-hole pairs. Therefore silicon defects, metallic impurities, and surface states must be controlled.

SUMMARY OF INVENTION

The invention provides a method for increasing the pixel density in a charge coupled device, with no diminution of sensitivity, by providing a semiconductor substrate having antiblooming profile formed therein, etching trenches in the silicon, forming N-channels along sidewalls of the trenches, forming a P+ region, a region of silicon doped to about $10^{17}$ atoms/cm$^3$ with an impurity such as B, Al, Ga, or In, to act as channel stop at the bottom of the trenches; successively forming P1 and P3 gates, the polysilicon transfer gates of the charge coupled device structure, and finally finishing by providing conventional contact, wiring, and passivation.

Where configured in a photosensitive manner, the invention provides for increased pixel density without loss of light sensitivity or resolution. In such configurations, the invention also obtains enhanced sensitivity to blue light. The increased sensitivity to blue light is achieved by maximizing the ratio of detection area to non-detection area and by reducing the thickness of the polysilicon gates. A further aspect of the invention is that the polysilicon line extends down along a first sidewall of a trench formed in the substrate, along the bottom of the trench, and up along the second sidewall as well as running along the top surface of the substrate. The P1 and P3 gates overlap predominantly on the sidewalls and bottom of the trench and to a lesser extent on the top surface of the substrate, so charge transfer occurs mainly along the sidewall gate. Utilization of the sidewall as gates allows for an increase in pixel area without a decrease in total gate area. This aspect of the invention allows more horizontal area to be available for openings in the polysilicon gates, thus admitting more light into the array.

The invention realizes a charge couple device characterized by having a series of vertical FETs creating a CCD scan chain in the sidewalls of trenches formed in a silicon substrate, CCD clock gates perpendicular to and filling the trenches and having narrow bands running across the plateau regions between trenches, charge generation regions on the tops of the plateaus; and charge transport regions along the trench side walls, wherein the sides of the trenches and the region over the plateau form a common charge collection well.

Another unique feature of the invention is the elimination of recess oxidation (ROX) isolation. Only the channel stop diffusion, and to a lesser extent the gate oxide, is used for channel isolation.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

SUMMARY OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF A PREFERRED EMBODIMENT

Reference is made to the figures to illustrate selected embodiments and preferred modes of carrying out the invention. It is to be understood that the invention is not hereby limited to those aspects depicted in the figures.

The invention utilizes sidewall as well as surface gates to increase pixel density without decreasing total gate area. Portions of the gate on vertical sidewalls, therefore more horizontal area, is available for openings in the polysilicon gates to admit more light into the channel region, thus the density of the array can increase without any loss of sensitivity.

The present invention is described in terms of a silicon substrate. It is to be understood that the present invention is applicable to semiconductor substrates other than silicon including, but not limited to silicon carbide and gallium arsenide. As used herein "metal lines" refers to lines or stripes of metals such as, but not limited to, copper or aluminum, and includes any high conductivity non-metal material such as highly-doped polysilicon or intermetalic silicides having high electrical conductivities associated with metals. Moreover, the terms "poly," "polysilicon," and "polycrystalline silicon" are used interchangeably as is standard in the prior art. Wherein reference is made to impurities of a "first type" it is such reference is understood to encompass impurities of either n or p-type. Following therefrom, reference to impurities of a "second type" refers to impurities of the opposite conductivity type. The terms "gate" and "gate electrode" are used interchangeably.

Figure 3:
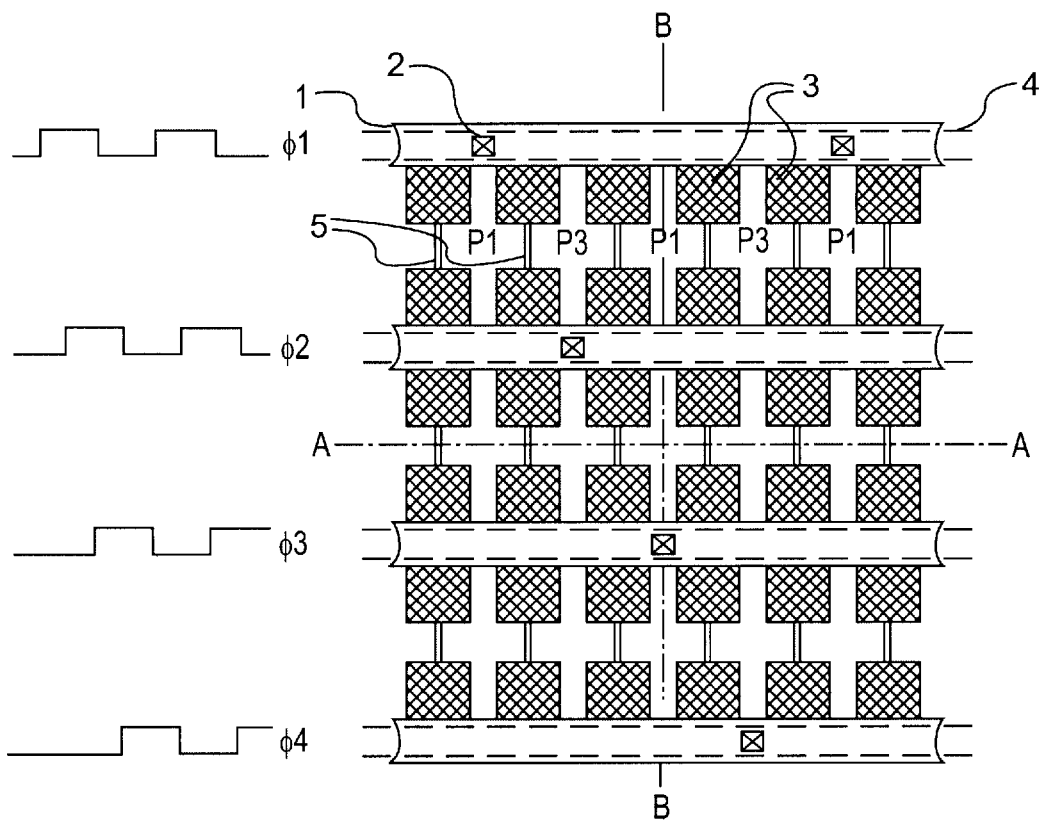
FIG. 3 is a top view of the present invention as a 4-phase charge-coupled device structure.
Figure 4A:
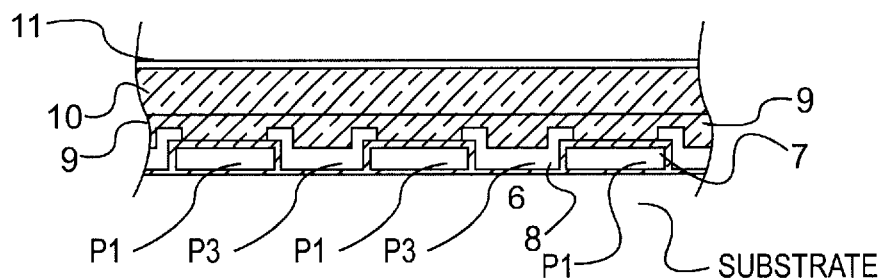
FIG. 4A is a section through line A—A of FIG. 3.
Figure 4B:
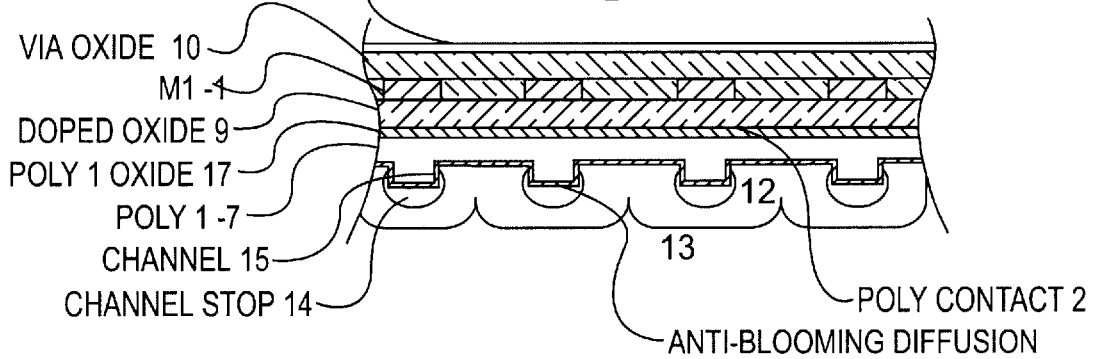
FIG. 4B is a section through line B—B of FIG. 3.

FIGS. 3, 4A and 4B illustrate the CCD of the present invention in a four-phase charge coupled device structure. FIG. 3 is a top view showing horizontal signal lines 1 running over the channel stop regions 4 and making connections 2 to every fourth gate. Holes 3 in the polysilicon admit light into the array.

FIG. 4A is a cross-sectional view through line A—A of FIG. 3, illustrating succesive layers of substrate 6, P1 7 and P3 8 polysilicon, doped oxide 9 (doped with boron and/or phosphorus or any extrinsic material), via oxide 10, and silicon nitride 11.

Figure 1:
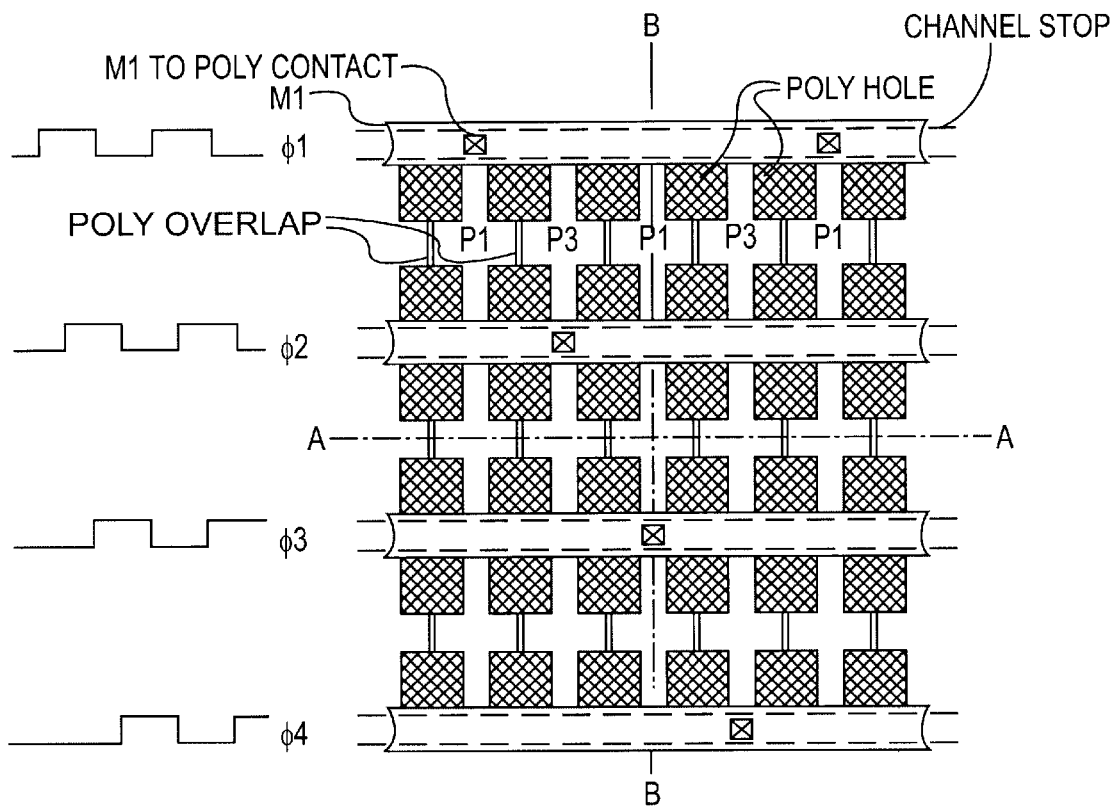
FIG. 1 is a top view of a Prior Art 4-phase charge couple device structure.
Figure 2A:
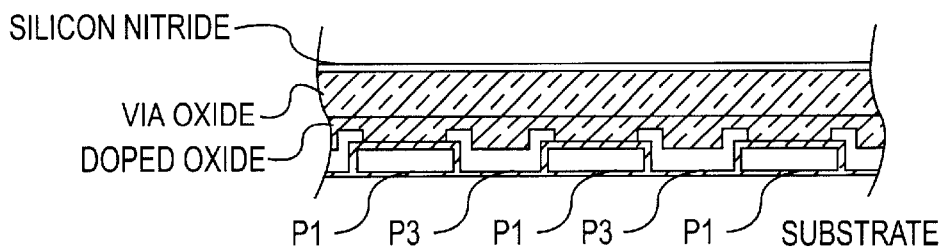
FIG. 2A is a section through line A—A of FIG. 1.
Figure 2B:
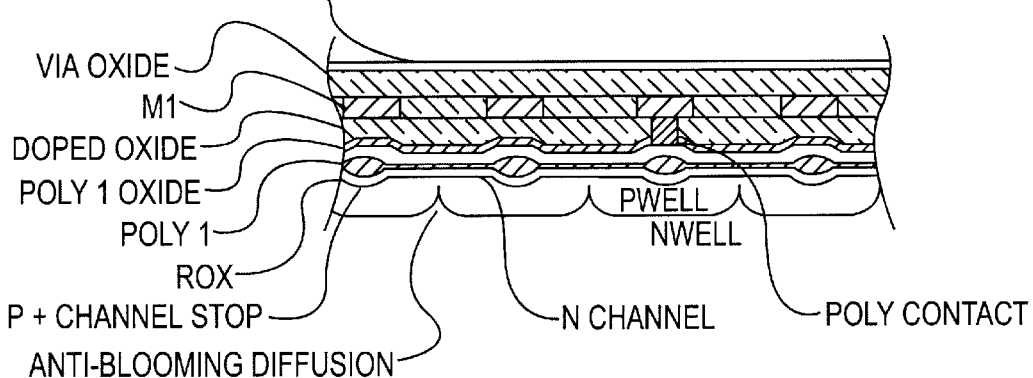
FIG. 2B is a section through line B—B of FIG. 1.

FIG. 4B is a cross-sectional view through line B of FIG. 3 across several channel regions. Peaked P-wells 12 are present in N-wells or N-type substrate 13 as an antiblooming device. Channel stop 14 is formed within each P-well associated with a channel 15. The polysilicon 7 and gate oxide 17 of the P1 gate is shown. A signal line to polysilicon contact 2 is shown embedded in a layer of doped oxide 9 that serves to isolate metal signal lines 1 from the P1 and P3 gates and to minimize device susceptibility to ionic contamination. Finally, layers of via or undoped oxide 10 and silicon nitride 11 are shown. It is in this view that the unique structure of the invention becomes clear, especially when contrasted with the prior art structure of FIG. 2B. It is clear that the polysilicon line extends down along a first sidewall of a trench formed in the substrate and along the bottom of the trench and up the second sidewall, as well as running along the substrate surface. Not clear in FIG. 4B, but will become clearer in subsequent Figures, is the P1 and P3 gates overlap predominantly on the sidewalls and bottom of the trench and, to a very small extent on the top surface, so charge transfer occurs mainly along the sidewall gate. Another unique feature is the elimination of the recessed oxidation (ROX) isolation. Only the channel stop diffusion is used (and the gate oxide to a small extent) for channel isolation.

Figure 5:
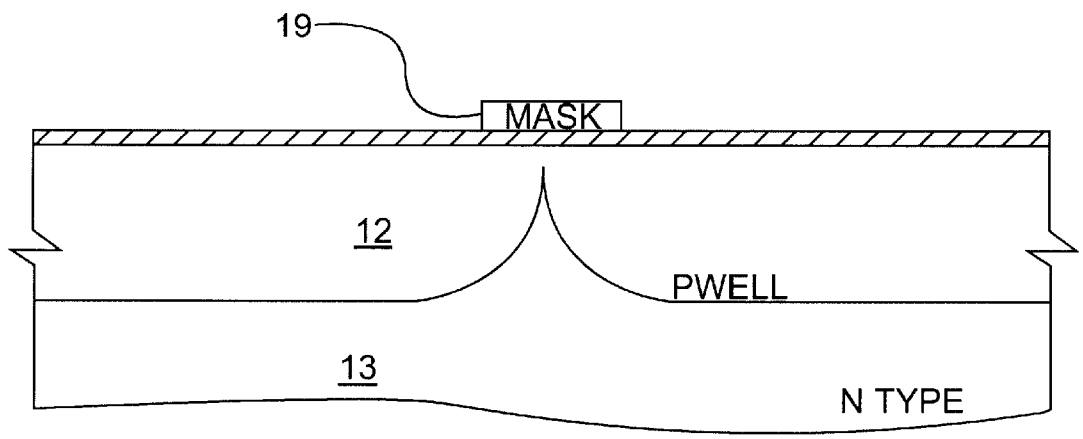
FIGS. 5–11 illustrate a preferred sequence of processing steps.

A preferred fabrication method is illustrated starting in FIGS. 5. What is presented is to be understood as a preferred embodiment. However, those skilled in the art will recognize that the invention is capable of being practiced in the opposite sense. Therefore where p-type material is indicated, it is understood that n-type material could be substituted and where n-type material is indicated, p-type material could be substituted. The process sequence starts with a silicon substrate, having any desired crystal orientation (e.g. <100>) in which an N-well (or N-type substrate) 13 has been formed and on the surface of which a sacrificial oxide 18 has been formed. The oxide may be fabricated by any known technique including thermal oxidation of the semiconductor surface or by vacuum or chemical vapor deposition. A mask 19 is used to define an ion implant for the P-well antiblooming device 12. A preferred p-type dopant is boron, but other p-type dopants for silicon include aluminum, gallium, and indium. Where boron is the dopant of choice, the preferred dopant concentration is about $2 \times 10^{15}$ atoms/cm$^3$. A suitable range is from about $1 \times 10^{15}$ atoms/cm$^3$ to about $6 \times 10^{15}$ atoms/cm$^3$. This is followed by resist stripping and annealing to form the peak.

Figure 6:
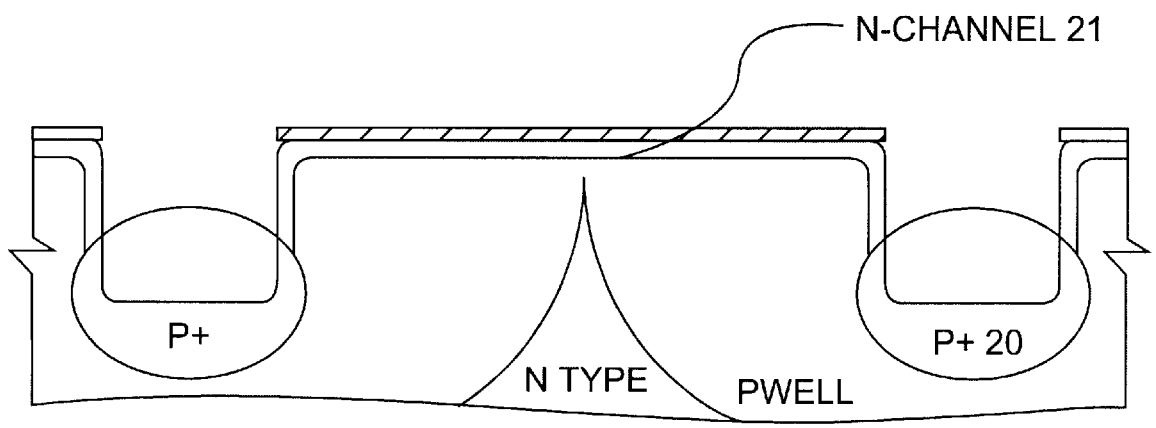

Turning now to FIG. 6, trenches are etched into the silicon substrate. Preferred dimensions include an inter-trench spacing of about 2 micrometers with trench dimensions of about 0.5 micrometers deep by 0.5 micrometers wide. In other embodiments the inter-trench spacing is from about 1 micrometer to about 10 micrometers. Ion implantation is used to form P$^+$($1 \times 10^{17}$ atom/cm$^3$) regions at the bottom of the trenches as channel stops 20. Boron is the preferred ion, but Al, Ga, and In are acceptable alternatives. This is followed by a 900° C. 5–10 minute H$_2$ atmosphere anneal to round the top and bottom corners of the trench. A two-angle (into both sidewalls of the trench) ion implantation is performed to form an N-channel 21 ($2 \times 10^{16}$ atom/cm$^3$). Phosphorus is the preferred ion, As and Sb are also suitable. the preferred angle is about 40° from the vertical, but a range of angles from about 10° to about 60° from the vertical is acceptable.

Figure 7:
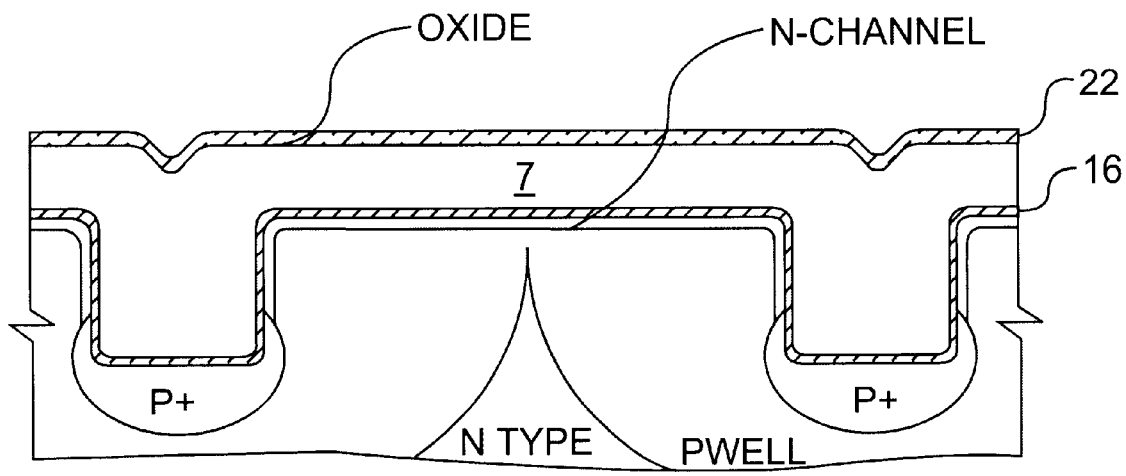
Figure 8:
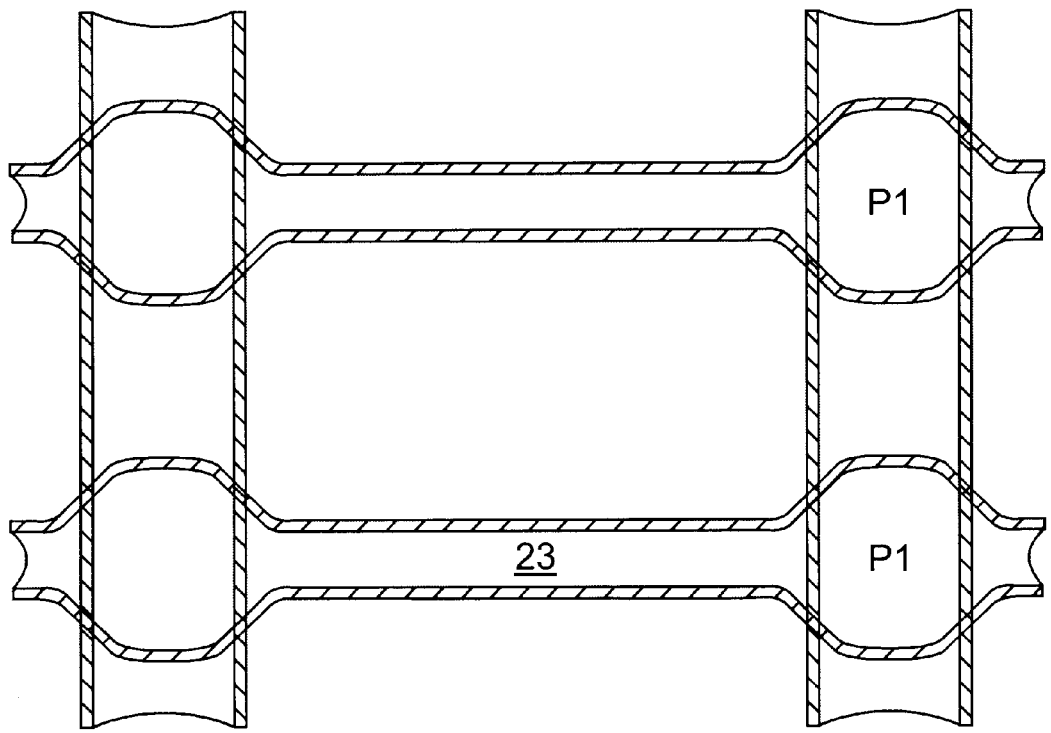

Turning now to FIG. 7 depicting the structure following removal of sacrificial oxide and formation of a 500 Å thick P1 gate oxide layer 16. P1 polysilicon 7 has been deposited to a sufficient thickness to completely fill the trench (about 2000 Å), etched into lines, and then oxidized with a standard P3 gate oxidation process 22. FIG. 8 shows the P1 line 23 being wider along the sidewalls and bottom of the trench. The edges of the trench and P1 lines have some cross-hatching in order to indicate the gate and trench P3 sidewall oxidation. Note the top surfaces are also oxidized.

Figure 9:
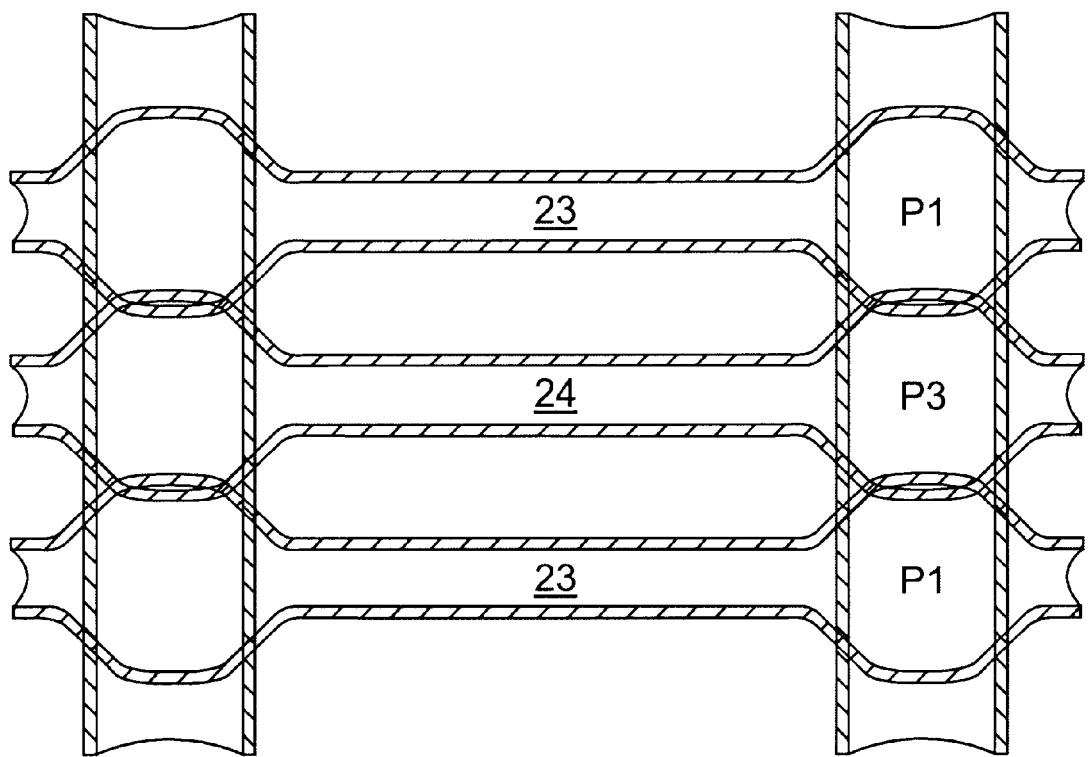

In FIG. 9, a P3 line 24 has been added showing the result after formation of the P3 gate electrode. Note how the P1 and P3 lines overlap along the trench sidewalls and bottom. The P3 polysilicon would also be about 200 Å thick.

Figure 10:
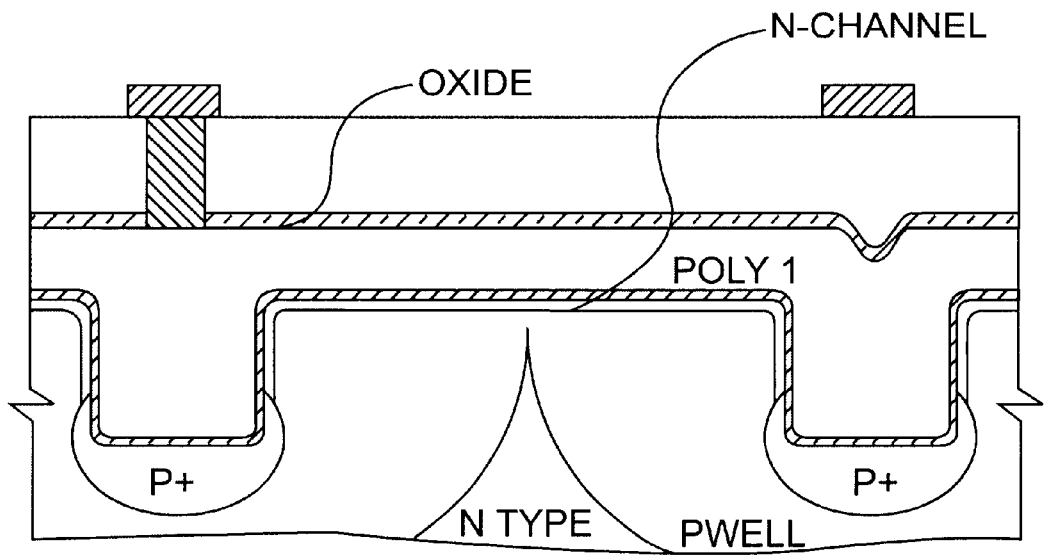
Figure 11:
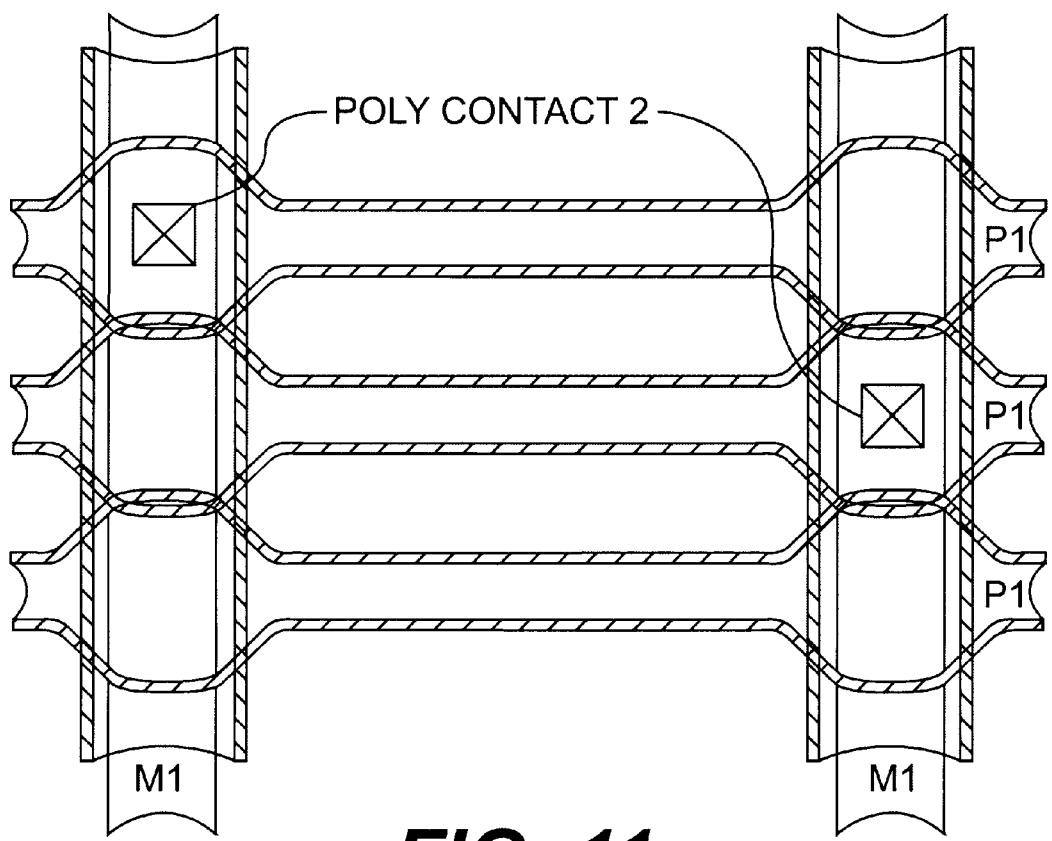

FIGS. 10 and 11 show the array, the contacts 2 to the P1 and P3 gates, and the first metal wiring 1 and interconnect 2.

It will, therefore, be appreciated by those skilled in the art having the benefit of this disclosure that this invention is capable of producing a charge couple device having sidewall gates. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense. Moreover, it is intended that the appended claims be construed to include alternative embodiments.

We claim:

1. A charge coupled device comprising:

a semiconductor substrate having an N-well with a plurality of peaks;

a plurality of P-wells in said N-well, wherein one of said peaks is formed between each pair of said plurality of P-wells, a plurality of trenches equivalent in number and corresponding to said plurality of P-wells wherein each said trench extends into the upper portion of each of said corresponding P-well, wherein the sides along the bottoms of each said trench are rounded by annealing, and wherein p-type channel stop is formed in the bottom of each of said plurality of trenches;

N-channels formed in each sidewall of each of said plurality of trenches;

a plurality of P1 lines wherein each of said P1 lines connects a plurality of P1 gates formed over said trenches; and a plurality of P3 lines wherein each of said P3 lines connects a plurality of P3 gates formed over said trenches.

2. A charge coupled device, according to claim 1, wherein said trenches are spaced about 2 micrometers apart and wherein the width of said trenches is about 0.5 micrometers and the depth of said trenches is about 0.5 micrometers.

3. A charge coupled device, according to claim 1, wherein said trenches are spaced from 1 micrometer to about 10 micrometers apart.

4. A charge coupled device, according to claim 1, wherein said P-type channel stop comprises P-type ions implanted to a concentration of about $1\times10^{17}$ atoms/cm$^3$.

5. A charge coupled device, according to claim 4, wherein said P-type ions are ions selected from the group consisting of boron, Al, Ga, and In.

6. A charge coupled device, according to claim 1, wherein said N-type channels comprise N-type ions implanted to a concentration of about $2\times10^{16}$ atoms/cm$^3$.

7. A charge coupled device, according to claim 6, wherein said N-type ions are ions selected from the group consisting of P, As, and Sb.

8. A charge coupled device, according to claim 1, wherein said P1 gates comprise polysilicon doped with said N-type ions to a concentration of about $1\times10^{19}$ atoms/cm$^3$ and wherein the thickness of said polysilicon is about 2000 Å.

9. A charge coupled device, according to claim 1, wherein said P3 gates comprise polysilicon doped with said N-type ions to a concentration of about $1\times10^{19}$ atoms/cm$^3$ and wherein the thickness of said polysilicon is about 2000 Å.

* * * * *